United States Patent
Beschnitt et al.

(10) Patent No.: US 12,296,681 B2
(45) Date of Patent: May 13, 2025

(54) OPERATING UNIT FOR A VEHICLE, IN PARTICULAR FOR OPERATING ONE OR SEVERAL COMPONENTS OF THE VEHICLE

(71) Applicant: BHTC GmbH, Lippstadt (DE)

(72) Inventors: Alexander Beschnitt, Lippstadt (DE); Pasi Kemppinen, Lippstadt (DE)

(73) Assignee: BHTC GmbH, Lippstadt (DE)

( * ) Notice: Subject to any disclaimer, the term of this patent is extended or adjusted under 35 U.S.C. 154(b) by 0 days.

(21) Appl. No.: 18/665,050

(22) Filed: May 15, 2024

(65) Prior Publication Data

US 2024/0391317 A1    Nov. 28, 2024

(30) Foreign Application Priority Data

May 22, 2023    (DE) .................. 10 2023 113 246

(51) Int. Cl.
| | |
|---|---|
| *B60K 35/10* | (2024.01) |
| *B60K 35/22* | (2024.01) |
| *B60K 35/25* | (2024.01) |
| *B60K 35/26* | (2024.01) |
| *G06F 3/041* | (2006.01) |
| *G06F 3/01* | (2006.01) |
| *G06F 3/16* | (2006.01) |

(52) U.S. Cl.
CPC .............. *B60K 35/10* (2024.01); *B60K 35/22* (2024.01); *B60K 35/25* (2024.01); *B60K 35/26* (2024.01); *G06F 3/041* (2013.01); *B60K 2360/119* (2024.01); *B60K 2360/131* (2024.01); *B60K 2360/139* (2024.01); *B60K 2360/1446* (2024.01); *B60K 2360/691* (2024.01); *G06F 3/016* (2013.01); *G06F 3/167* (2013.01); *G06F 2203/04105* (2013.01)

(58) Field of Classification Search
CPC ........ B60K 1/00; B60K 35/00; B60G 17/015; G06F 3/0488

See application file for complete search history.

(56) References Cited

U.S. PATENT DOCUMENTS

2015/0291034 A1    10/2015    Marquas

FOREIGN PATENT DOCUMENTS

| | | | |
|---|---|---|---|
| DE | 10-2013-006415 A1 | 10/2014 | |
| DE | 10-2020-127418 A1 | 4/2022 | |
| WO | 2016-012241 A1 | 1/2016 | |
| WO | 2016-012243 A1 | 1/2016 | |

OTHER PUBLICATIONS

Search Report from corresponding European Patent Application No. 24177280 dated Dec. 1, 2024.

*Primary Examiner* — Nan-Ying Yang
(74) *Attorney, Agent, or Firm* — Christensen, Fonder, Dardi PLLC; Diane E. Bennett; Peter S. Dardi

(57) ABSTRACT

The operating unit for a vehicle comprises a housing (12) having an operating panel (18) on its front side (14). The operating panel (18) is supported in the housing by a support member (24), which is elastically mounted at its rear end and in the front area in or on the housing (12), respectively. A rear mounting member (30) having an elastically twistable strut (38) is used for this purpose at the rear end of the support member (24). Said strut (38) is substantially parallel to an imaginary connecting line (44) between the lateral ends (22) of the operating panel (18).

18 Claims, 11 Drawing Sheets

Figure 1:
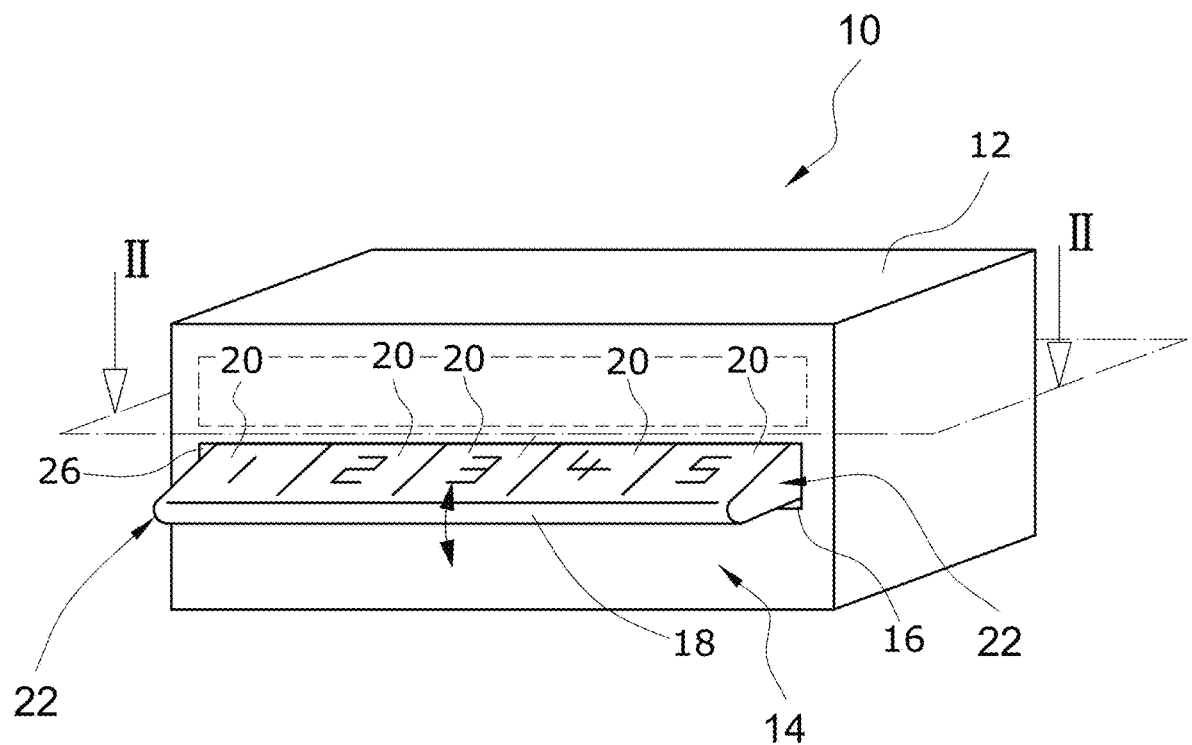

OPERATING UNIT FOR A VEHICLE, IN PARTICULAR FOR OPERATING ONE OR SEVERAL COMPONENTS OF THE VEHICLE

CROSS REFERENCE TO RELATED APPLICATIONS

This application claims priority to German Patent Application No. DE 10 2023 113 246.6, filed May 22, 2023, incorporated herein by reference.

The invention relates to an operating unit for a vehicle, in particular for operating one or several components of the vehicle, such as a central input device (CID). The operating unit can be configured with or without a display device.

Central input devices with or without a display unit for vehicles are known in prior art. Operating units of the type to which the invention relates have an operating panel which projects beyond the front or top of a housing. Examples for such operating units are described in WO 2016/012241 A1 and WO 2016/012243 A1

In order to be able to carry out as many operating functions as possible with manually actuatable operating panels, said operating panels should be relatively long. A disadvantage of relatively long operating panels is the mechanical and design effort required to ensure that the kinematics of the operating panel are as similar as possible, regardless of where it is actuated (by pushing or pulling). This is because a sensor system should be able to reliably detect that the operating panel has been validly pressed, i.e. pressed in such a way that the intended operating function is triggered, regardless of where the operating panel is actuated.

Long operating panels tend to deform before the operating panel itself has been actuated to such an extent that a sensor system senses a valid actuation of the operating panel. By providing several force or distance sensors distributed across the length of the operating panel, it is possible to compensate for the fact that the operating panel behaves differently depending on the actuation location until a valid actuation of the operating panel is detected, at the expense of increased electronic hardware and software effort. However, this is associated with considerable design and installation effort.

It is an object of the present invention to provide an operating unit for a vehicle, in particular for operating one or several components of a vehicle, such as a central input device (CID), which has a simple mounting of a movable operating panel.

The object of the invention is achieved with the invention proposing an operating unit for a vehicle, in particular for operating one or several components of the vehicle, such as a central input device (CID), wherein the operating unit is provided with

- a housing having a front side,
- an operating panel projecting beyond the front side and movable between a rest position and an actuating position, said operating panel having an operating surface with several operating fields for triggering operating functions, which operating fields are arranged next to one another in the longitudinal extension of the operating panel and between two lateral ends of the operating panel and can be actuated manually or by means of an actuating object,
- a sensor system for detecting a valid actuation of the operating panel,
- a support member connected to the operating panel, which extends from the operating panel further into the housing and has a rear end facing away from the operating panel and two side ends adjacent to the lateral ends of the operating panel, and
- a mounting device arranged in the housing for movable mounting of the support member when the operating panel moves from the rest position to the actuating position and moves back, wherein the support member is movably mounted on the mounting device so that it can be reset,
- wherein the mounting device comprises at least one rear mounting member for the rear end of the support member and at least one front mounting member which interacts with the end of the support member facing the operating panel and/or with the operating panel and is of elastic design, and
- wherein the at least one or each rear mounting member comprises an elastically twistable strut having a longitudinal axis extending substantially parallel to an imaginary connecting line connecting the two lateral ends of the operating panel between a mounting end of the rear mounting member at which the strut is rigidly fixed inside the housing and a connecting end of the rear mounting member at which the strut is rigidly connected to the rear end of the support member.

The operating unit according to the invention comprises a housing having a front or top side (hereinafter always referred to as the front side), beyond which an operating panel projects, which operating panel has an operating surface with several operating fields for triggering operating functions, which operating fields are arranged next to one another in the longitudinal extension of the operating panel and between two lateral ends of the operating panel and can be actuated manually or by means of an actuating object. The operating panel is movable between a rest position and an actuating position about an axis of rotation, which can also be virtual. The operating panel is connected to a support member or part of a support member extending from the operating panel into the housing or extends in the housing, respectively, wherein the rear end of the support member should be as far away from the operating panel as possible. A mounting device is provided in the housing, via which the support member is movably mounted between its rest position and its actuating position, wherein said mounting is resettable, so that after actuation of the operating panel it automatically returns from its actuating position to the rest position. The mounting device comprises at least one rear mounting member for the rear end of the support member and at least one front mounting member which interacts with the (front) end of the support member facing the operating panel and/or with the operating panel itself and, like the rear mounting member, is of elastic design. The mounting members can be an integral part of the support member and/or the operating panel.

The rear mounting member comprises at least one elastically twistable strut having a longitudinal axis and thus a longitudinal extension. The longitudinal axis of at least one twistable elastic strut is parallel to an imaginary connecting line between the two lateral ends of the operating panel. The operating panel can be curved or straight between these two lateral ends, for example for design reasons. Inside the housing, the strut is rigidly connected to the housing at one of its ends, specifically at the fixing end, and fixed there, while its other end, specifically its connecting end, is rigidly connected to the rear end of the support member.

If the operating panel is pressed, pulled or pushed in order to move it from its rest position to the actuating position, the at least one strut of the rear mounting member is twisted. The return movement into the rest position of the operating panel can be supported by the at least one front mounting member, which is also of elastic design. The twistable struts achieve a constant pivoting or rotating movement of the operating panel that is independent of the actuation location on the operating panel, wherein the axis of rotation extends inside the strut or at least close to the strut (in the latter case as an imaginary axis of rotation).

To increase the stabilization of the rotating or pivoting movement of the operating panel, it is advantageous if the operating panel or the support member has two front mounting members that are arranged in the area of the side ends of the support member and/or the lateral ends of the operating panel.

For further stabilization of the kinematics of the support member, operating element and mounting device, which remain as similar as possible regardless of the actuation location, it is advantageous if there are at least two rear mounting members at the rear end of the support member, each of which has a twistable elastic strut.

The elastically twistable strut of each rear mounting member is expediently formed as a rod with a round or polygonal cross-section. The entire rear end of the support member and advantageously the support member itself can be made of elastically deformable plastic, wherein the plastic construction is sufficiently stiffened to enable the desired effect, i.e. a movement about an axis of rotation. As an alternative to a plastic version of each rear mounting member or the rear end of the support member, respectively, each rear mounting member can also have a leaf spring made of metal, preferably spring steel. Said leaf spring is preferably aligned substantially vertically and thus upright, so that its two main side surfaces point towards the operating panel on the one hand (applies to the main side surface facing the support member) and away from the operating panel on the other. In the context of the invention, this alignment of the strut, which is designed as a flat material strip (made of spring steel or plastic) and previously referred to as "vertical", is still considered to be "vertically" aligned even if it is tilted by less than 45° with respect to the vertical.

The alignment of the flat material strip made of metal, in particular spring steel or plastic, referred to as "vertical" in this respect, therefore distorts between its two ends, specifically between its fixing end on the housing and its connecting end on the support member. This distorting or twisting movement differs from the elastic deformation of the flat material strip if the latter was arranged horizontally.

In the event that the strut is configured as a vertically aligned flat material strip, there is substantially an axis inside the flat material strip during twisting, with respect to which the part located on one side of the flat material strip is deformed in a direction that is opposite to the direction of deformation of the opposite portion of the flat material strip.

As described above, it is therefore advantageous if the strut of the at least one or each rear mounting member is formed as a flat material strip having two main side surfaces, wherein the main side surfaces of the flat material strip are aligned vertically or tilted by less than 45° with respect to the vertical.

As already described above, it can be advantageous if the mounting device has two rear mounting members, the two struts of which extend from a common fixing end in opposite directions to their respective connecting ends, at which they are rigidly connected to the rear end of the support member. In this case, the two struts extend from a common fixing end arranged substantially in the middle between the two struts in opposite directions to their respective connecting ends. It is advantageously possible for the two struts to be integrally connected to each other at their fixing ends to form a common strut and to define a central fixing portion of the common strut, from which the common strut extends in two mutually opposite directions to its connecting ends connected to the support member. The strut has two diametrically opposed arms, so to speak, pointing away from each other.

Without changing the kinematics and dynamics, said construction can also have an inverse structure, in that the two struts of two rear mounting members are brought together at their connecting end connected to the support member in order to extend from said connecting end in mutually opposite directions to their respective fixing ends. Also in this respect, it is expedient if the two struts are integrally connected to one another at their connecting ends to form a common strut and define a central connecting portion of the common strut, inside which the common strut is connected to the support member and from which the common strut extends in two mutually opposite directions to its fixing ends rigidly fixed directly or indirectly inside the housing.

In a further advantageous configuration of the invention, it may be provided that the support member is designed in the form of a plate which is arranged centered in relation to the longitudinal extension of the operating panel.

As an alternative to the configuration of the invention described above, it is possible for the support member to have two support arms connected to the operating panel, which are arranged symmetrically with respect to an imaginary line of symmetry extending transversely to the extension of the operating panel through its center, wherein a rear mounting member is arranged on each support arm at its rear end facing away from the operating panel.

As already described above, it can be expedient if the mounting device has two front mounting members which are arranged opposite each other on the two lateral sides of the support member or the two lateral ends of the operating panel.

Furthermore, it can be advantageous if the at least one or each rear mounting member is an integral part of the rear end of the support member or, if the support member has support arms, is an integral part of the rear ends of the support arms of the support member.

As also already explained above, it is expedient and advantageous if the strut of the at least one or each rear mounting member is formed as a leaf spring, which is alternatively made of plastic or spring steel or another resilient material.

In a further advantageous configuration of the invention, it may be provided that the spring of the at least one or each front mounting member is formed as a leaf spring made of plastic or spring steel or as a coil spring made of plastic or spring steel.

As already explained above, in order to detect a valid actuation of the operating panel, a sensor system is required to detect a specified minimum degree of movement of the operating panel from its rest position to the thus defined actuating position. For this purpose, it can be advantageously provided that said sensor system has at least two force and/or distance sensors for detecting the force that acts on the operating panel when it is actuated and/or the distance by which the operating panel moves when it is actuated, and an evaluation unit that receives measurement signals from the sensors and uses these measurement signals to generate a signal representing the actuating position on the operating panel and a signal representing a valid actuation of the operating panel. The measured values supplied by the at least two and preferably up to five sensors are characteristic for each actuating position on the operating panel, so that it is possible to read from the "measured value image" of the force or distance sensors where the operating panel has been actuated.

Alternatively, the operating panel can have a touch-sensitive film arranged in or on the operating panel as a position detection sensor system, which emits a signal representing the actuating position when the operating panel is touched and/or actuated, as well as at least one force and/or distance sensor for detecting the force acting on the operating panel when it is actuated, and/or the distance by which the operating panel moves when it is actuated, and an evaluation unit that receives signals from the at least one sensor and the touch-sensitive film and uses these signals to generate a signal representing the actuating position on the operating panel and a signal representing a valid actuation of the operating panel.

Advantageously, the operating unit according to the invention can be provided with
- a display unit with a display surface arranged above and/or below the operating panel for displaying alphanumeric and/or graphic information relating to the operating functions assigned to the respective operating field, or
- a display unit integrated in the operating panel with a display surface for displaying alphanumeric and/or graphic information relating to the operating function assigned to the respective operating field, or
- unchangeable alphanumeric and/or graphic information, e.g. in the form of symbols, icons or the like on the operating panel.

Finally, it is advantageous for the comfort of actuating the operating panel if the operating unit has a passive or an active haptic feedback unit for generating acoustic and/or tactile feedback upon valid actuation of the operating panel. For example, the passive haptic feedback unit could be realized using a mechanical switch which, in addition to being haptic when actuated, could also be used to signal a valid actuation of the operating panel. In an active haptic feedback unit, the support member or the operating panel is mechanically excited in the form of a pulse, which can be realized using an actuator, for example a piezo actuator or an electromagnetically operating actuator.

Figure 2:
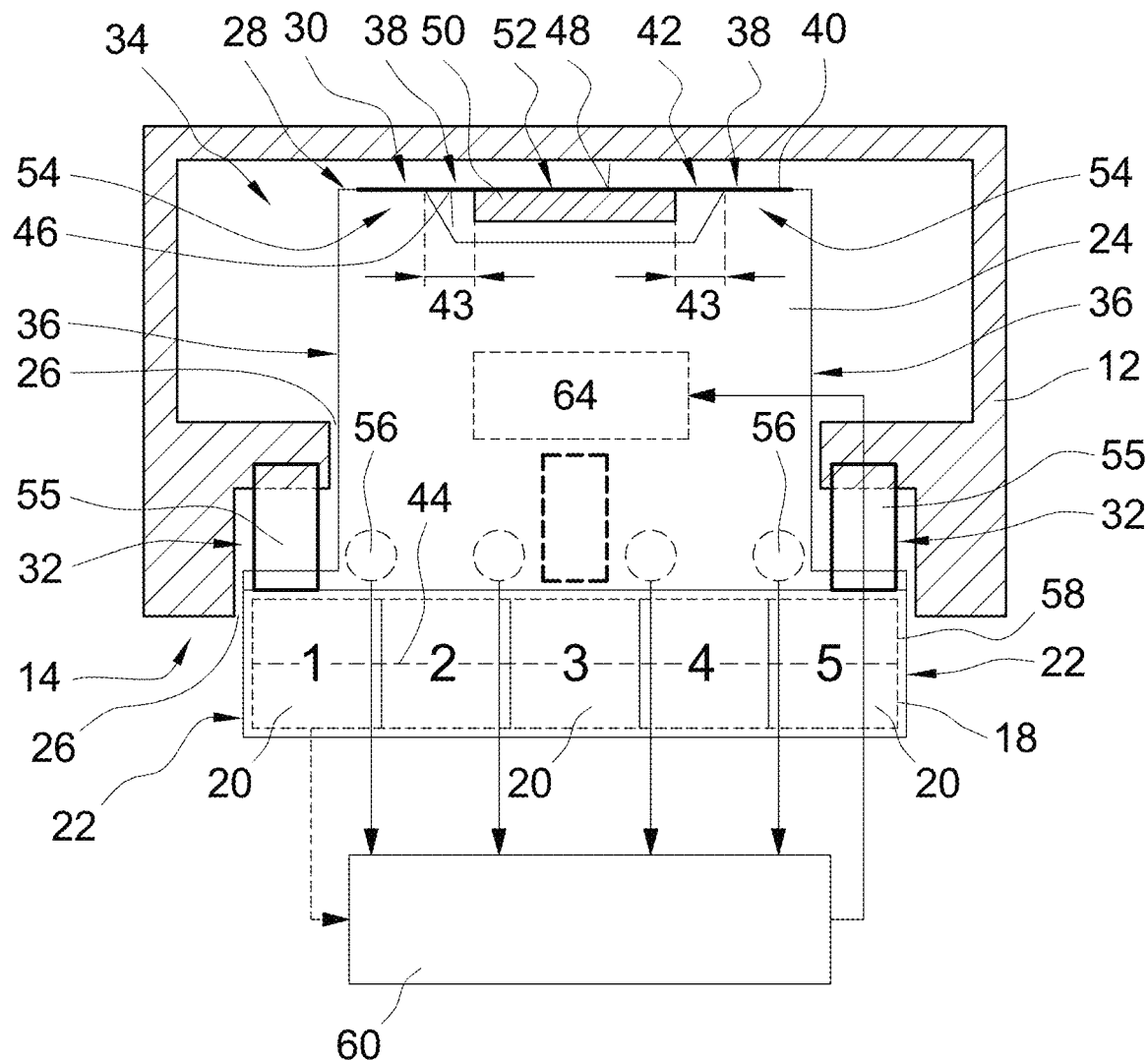
Figure 3:
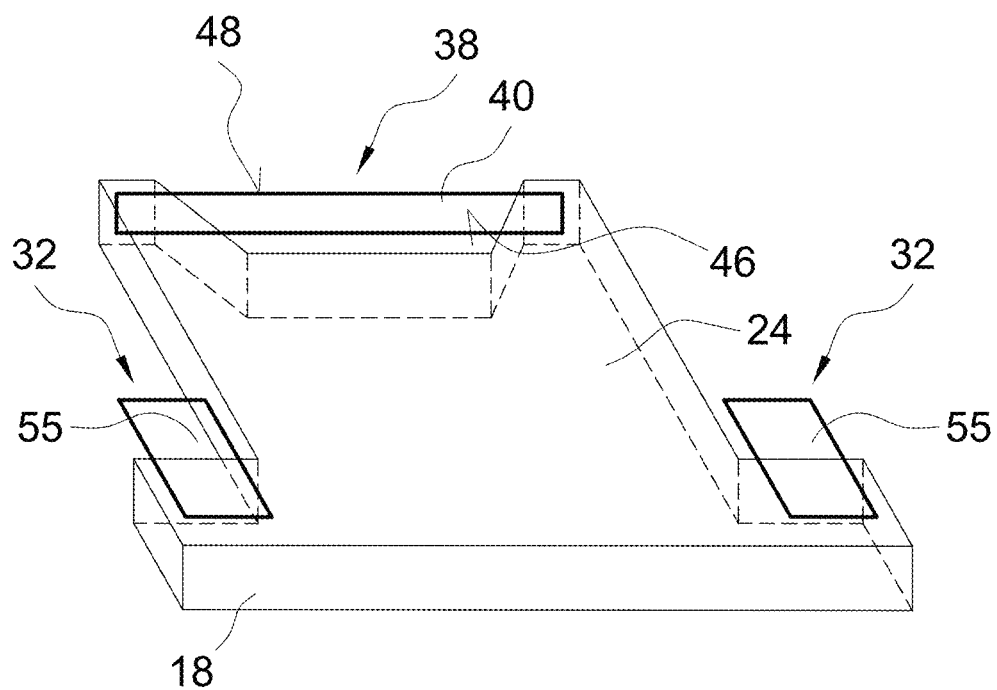
Figure 4:
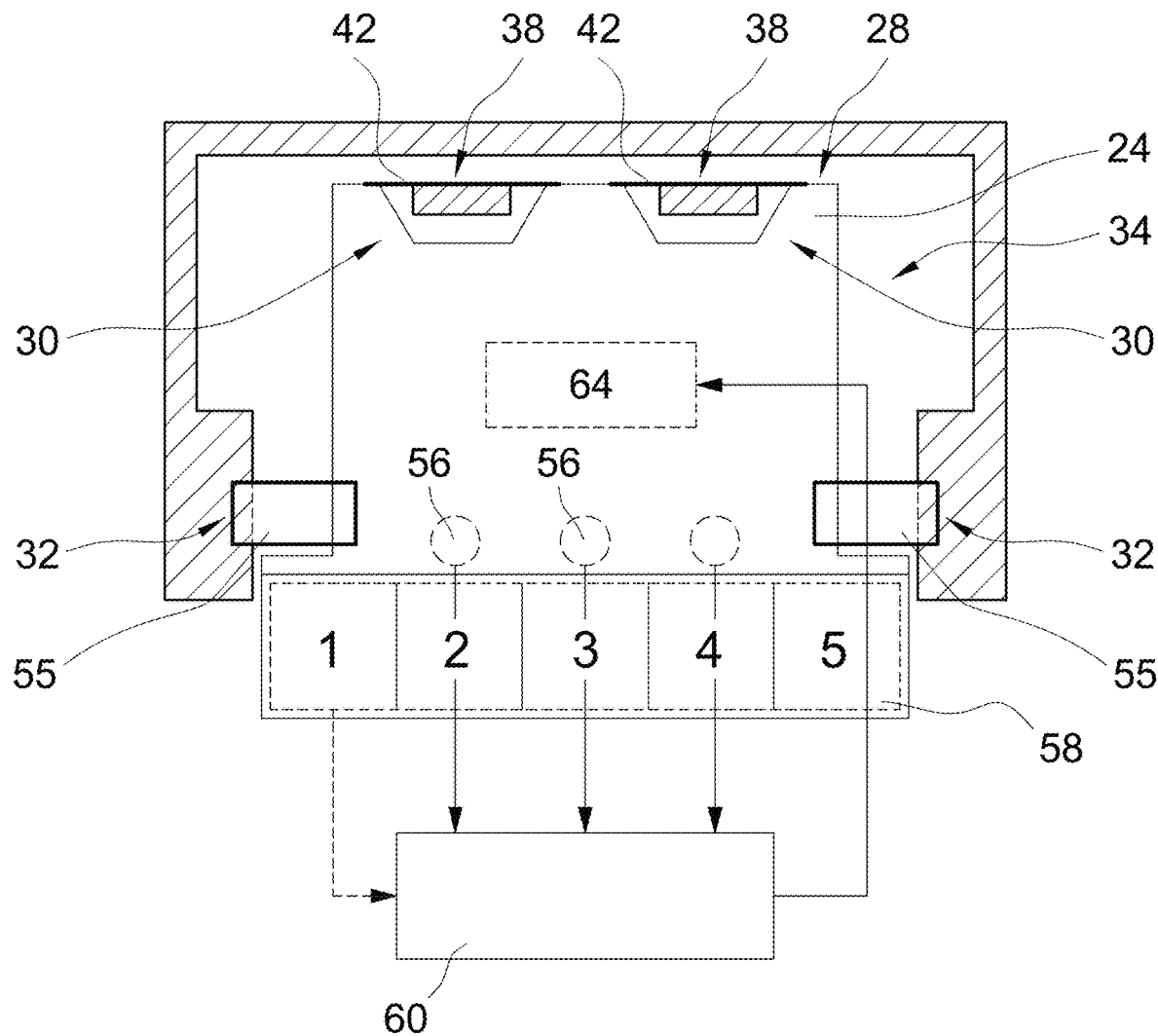

The invention is explained in more detail below by means of several exemplary embodiments and with reference to the drawings. In detail, the Figures show:

FIG. 1 shows a perspective view of an operating unit in which the invention can be realized in several embodiments, FIG. 2 shows a horizontal section according to the plane II-II of FIG. 1 for illustrating a first exemplary embodiment of the mounting of support member and operating panel, FIG. 3 shows a perspective view of the support member with indicated elastic mounting, FIG. 4 shows a sectional view similar to the one according to FIG. 2 for a variant of the operating panel or the support member, respectively, and FIG. 5 to FIG. 11 show a schematic view of further configurations, in particular of the rear mounting of the support member, which are made of plastic.

FIG. 1 shows a perspective view of an operating unit 10 comprising a housing 12 having a front side 14. An operating panel 18 projects from an opening 16 of front side 14 of housing 12 and can be transferred from its rest position shown in FIG. 1 to an actuating position by pressing it. In the same way, operating panel 18 can also be transferred from the rest position shown to the actuating position by lifting it.

Finally, it is also possible for operating panel 18 to be transferred from its center or rest position to two different actuating positions both by pressing it and by lifting it. The degree of movement of the operating panel between the rest position and the or each actuating position is typically quite small.

Operating panel 18 has several operating fields 20 (five operating fields in the exemplary embodiment) which are located next to each other between the two lateral ends 22 of operating panel 18.

In FIGS. 2 and 3, it can be seen that operating panel 18 is supported by a support member 24 which extends from operating panel 18 further into housing 20, for which purpose the latter has an opening 26 on its front side 14. Inside housing 12, support member 24 is mounted on its rear end 28. For this purpose, a rear mounting member 30 is used in this exemplary embodiment, which will be discussed later. The rear mounting member 30 together with at least one (in this exemplary embodiment two) front mounting members 32 is part of a mounting device 34. The front mounting members 32 are located on the side edges 36 of support member 24 in the area of operating panel 18, specifically in the area of the lateral ends 22 of operating panel 18. In FIG. 2, the positioning of a further front mounting member 32 is shown as a dashed line, wherein alternatively the mounting member (indicated by a dashed line) arranged in the exemplary embodiment of FIG. 2 at the height of the center of operating panel 18 can be the only front mounting member or an additional front mounting member.

In this exemplary embodiment, the rear mounting member 30 is respectively formed as a twistable strut 38 in the form of a flat material strip 40 made of spring steel, i.e. as a leaf spring 42. The flat material strip 40 of each leaf spring 42 is formed vertically and extends parallel to an imaginary connecting line 44 between the two lateral ends 22 of operating panel 18. In the center of each leaf spring 42, the latter is rigidly fixed to a fixing block or a similar fixing member 50 on one of its main side surfaces 46, 48 inside housing 12. Leaf spring 42 extends on both sides of said fixing member 50 and forms two twistable elastic struts 38. The two struts 38 are thus formed in one piece, with leaf spring 42 forming the fixing ends 52 of the two struts 38 in its central section, while the leaf spring portions extending in opposite directions form the connecting ends 54 of each strut with the rear end 28 of support member 24 at their two opposite ends. The struts 38 are rigidly connected to supper member 24 at their connecting ends 54. The choice of the material of the struts 38, their geometric shape and/or the length of the "exposed" and thus twistable areas 43 of leaf spring 42 defines the degree of twistability and elasticity of the struts 38.

The front mounting members 32 extend between operating panel 28 or support member 24, respectively, and the housing. The elastic front mounting members 32, which are formed as leaf springs 55 in the form of spring tongues, support a return movement of the actuated operating panel 18 in addition to the or each rear mounting member 30, as described below.

As can be seen from FIG. 2, leaf spring 42 is exposed in its region 43 between the connecting ends 54 and the fixing ends 52 of the struts 38, so that leaf spring 42 twists in said exposed regions when operating panel 18 is actuated by pushing or pulling (or lifting). During this process, the leaf springs 55 of the front mounting member 32 are also deformed. When the actuating force is released, operating panel 18 then automatically moves back to its rest position, which is ensured by leaf spring 55 of the rear mounting members 30 and the leaf springs 42 of the front mounting members 32.

FIG. 3 again shows a perspective view of support member 24 with operating panel 18 and the arrangement of the various leaf springs 42, 55 at the rear end of support member 24 (without fixing member 50 of the housing) and at its lateral edge.

FIG. 4 shows a variant of mounting device 34 of the exemplary embodiment according to FIGS. 2 and 3. Insofar as the components of the operating device in this exemplary embodiment are structurally or functionally identical to those of the operating unit according to FIGS. 2 and 3, they are provided in FIG. 4 with the same reference numerals as in FIGS. 2 and 3.

The leaf springs 55 of the front mounting members 32 are twisted by 90° compared to the alignment in the exemplary embodiment shown in FIGS. 2 and 3. At the rear end 28 of support member 24 there are two pairs of mounting members 30, each of which is configured as shown in FIGS. 2 and 3.

In FIGS. 2 to 4, a sensor system and electronics are also indicated which are used for detecting a touch of operating panel 18 or for detecting a valid actuation of operating panel 18, respectively. According to FIGS. 2 and 4, operating panel 18 has either several force or distance sensors 56 (four such sensors in the exemplary embodiment), which are arranged distributed across the length or width of operating panel 18. Said sensors detect a degree of deformation or movement of areas of operating panel 18 when they are actuated, whereby, on the one hand, a valid actuation of operating panel 18 and, on the other hand, the measured value image of said sensors 56 can be used to detect where operating panel 18 has been actuated. As an alternative to the position detection via the multiple sensors 56, operating panel 18 can also have a touch-sensitive film 58, which is indicated by a dashed line in FIGS. 2 and 4. With this type of position selection, however, at least one force or distance sensor is also required in any case in order to detect a valid actuation of operating panel 18, i.e. in order to detect the minimum amount of movement of operating panel 18 for triggering an operating function.

In both cases, the signals of the sensor system are fed to an evaluation and control unit 60, which has, for example, a microcontroller with corresponding peripherals and components (such as I/O interfaces, CPU and memories). When a valid actuation of operating panel 18 is detected, the evaluation and control unit 60 can, for example, output a control signal to an actuator 64 for pulse-like mechanical excitation of operating panel 18 or support member 24, respectively, in order to output tactile feedback in this way to confirm a valid actuation of operating panel 18. Such haptic feedback systems are generally known in prior art. In this exemplary embodiment, said feedback system is active. However, a passive feedback system could also be provided, which comprises a pushbutton or similar mechanical switch, for example, whose distance-force characteristic is used to generate the haptic feedback.

FIGS. 5 to 11 schematically show further alternatives of the configuration of the rear mounting members 32, wherein said rear mounting members 32 are formed integrally with support member 24, which typically comprises plastic. Insofar as FIGS. 5 to 11 show components of support member 24 and the rear mounting members 30 which are structurally or functionally identical to those of FIGS. 2 to 4, they are provided in FIGS. 5 to 11 with the same reference numerals as in FIGS. 2 to 4.

Figure 5:
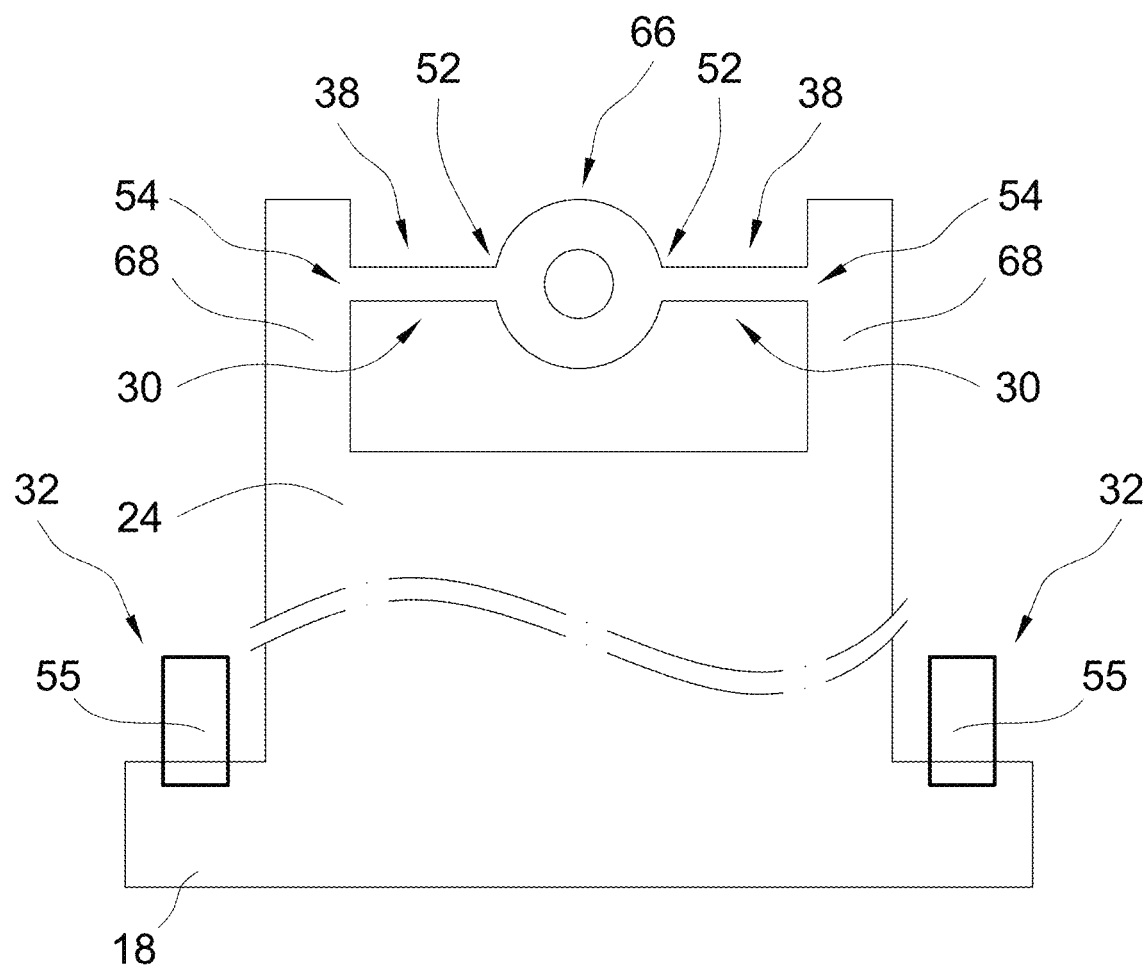

FIG. 5 shows how the struts 38 (of e.g. rectangular cross-section and made of e.g. plastic) of the two rear mounting members 30 extend from a central fixing member 66 in diametrically opposite directions to their connecting ends 54 on the inner sides of two support arms 68. The central fixing member 66 is rigidly fixed in the housing (not illustrated). If force is now exerted on operating panel 18, the struts 38 twist elastically between their fixing ends 52 and their connecting ends 54, wherein the front mounting ends 32, i.e. their leaf springs 55 in the form of spring tongues, also ensure the return movement.

Figure 6:
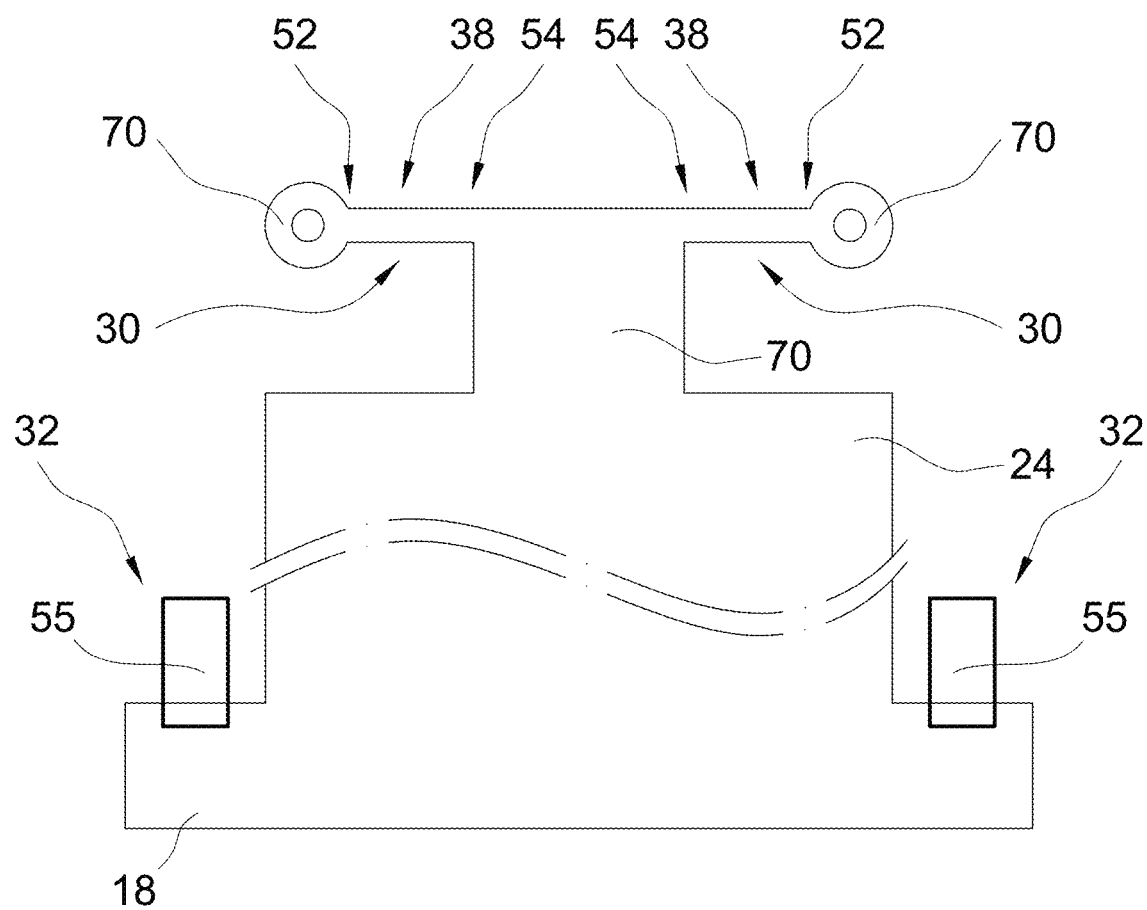

FIG. 6 shows an exemplary embodiment in which, starting from a central rear extension 69 of support member 24, the struts 38 (e.g. also made of plastic and rectangular in cross-section) of two rear mounting members 30 project laterally in diametrically opposite directions. At their external fixing ends 52, the two struts 38 are connected to fixing blocks 70, which in turn are firmly fixed in the housing. When operating panel 18 is deflected, the struts 38 twist, which in turn is reversed when the force applied to operating panel 18 has ceased.

Figure 7:
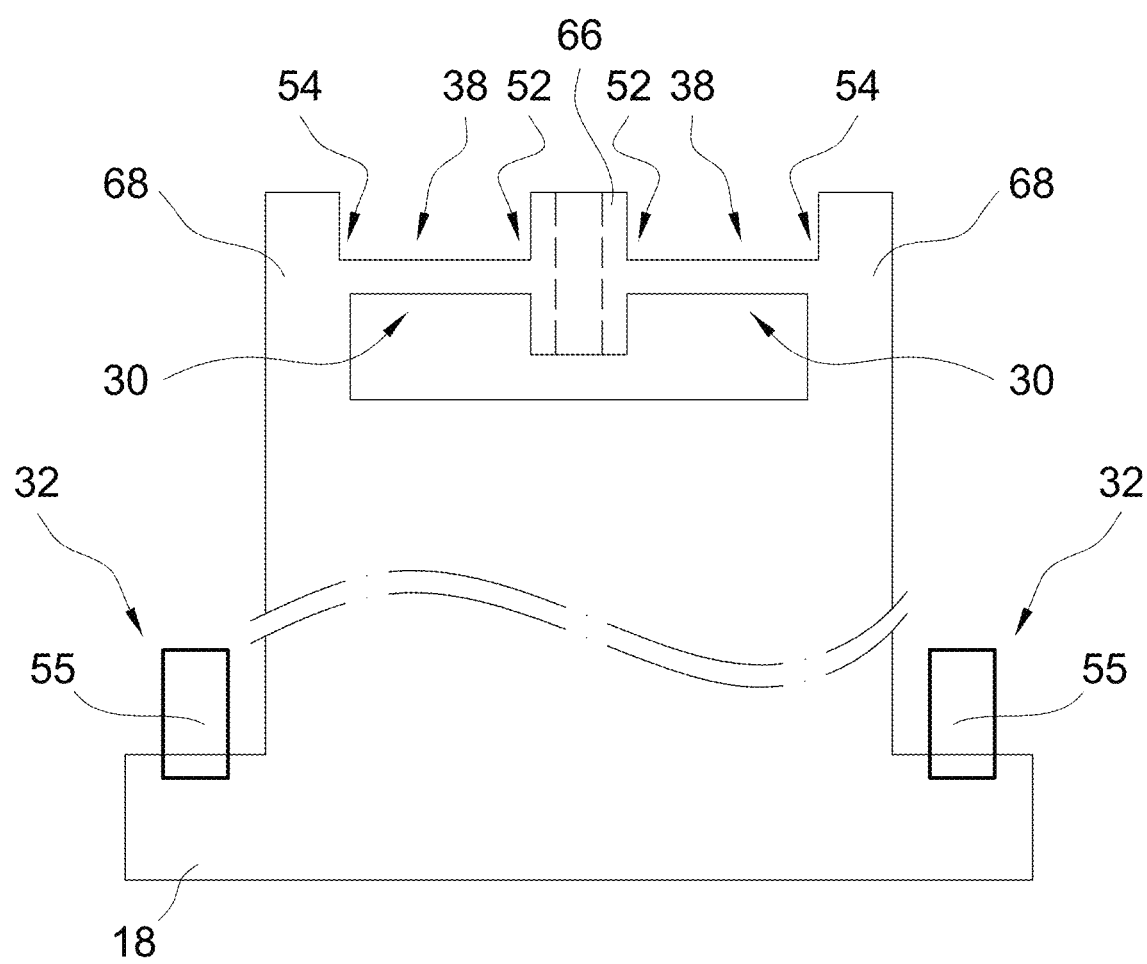

FIG. 7 shows a variant of the design of the rear mounting members 30 similar to those shown according to FIG. 5. The central fixing member 66 is rotated by 90° compared to the embodiment according to FIG. 5 and is fixed, for example, to the rear housing wall (not illustrated).

Figure 8:
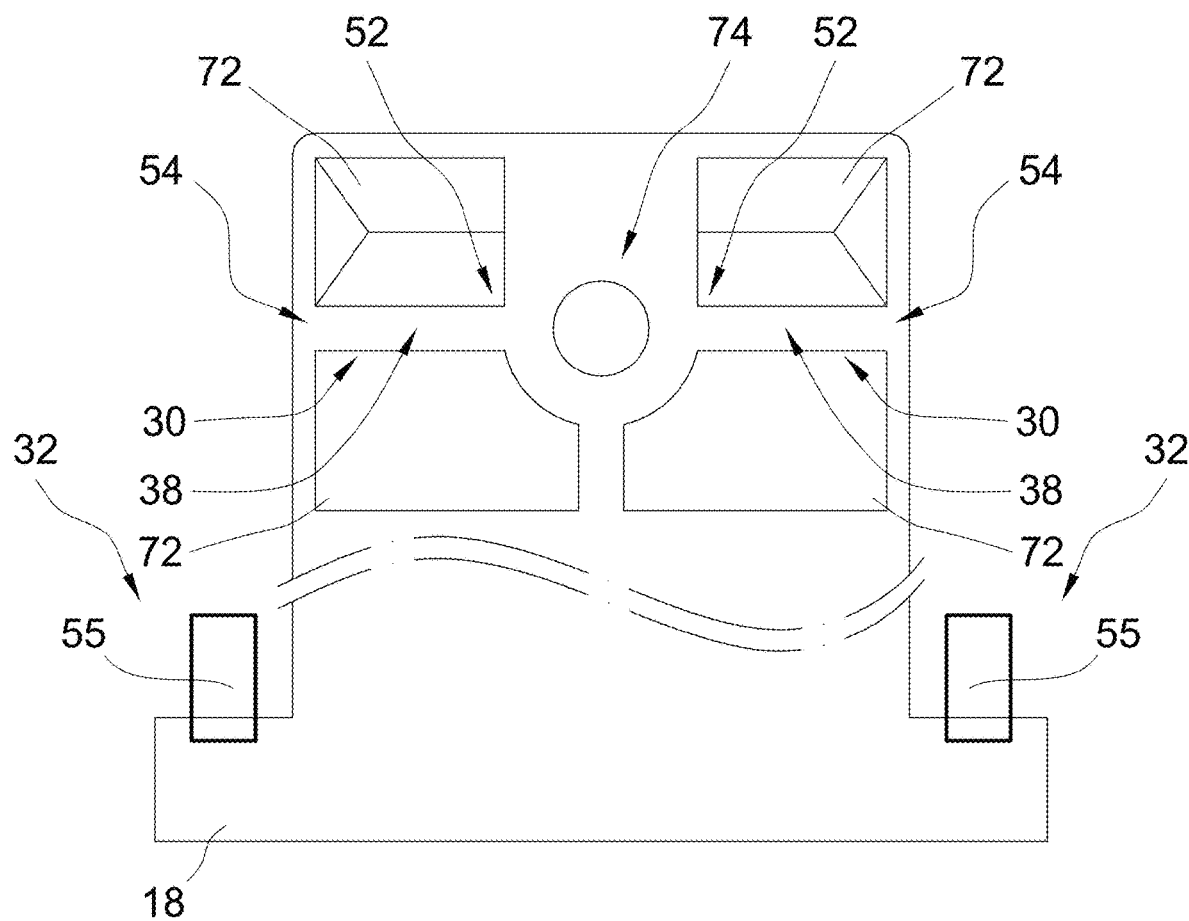

FIG. 8 shows a structure of the rear end of support member 24, in which the latter is provided with apertures 72, some of which are configured as recesses open on one side. This results in twistable struts 38, which in turn form the rear mounting members 30. The construction is fixed in the housing on central fixing block 74. When force is applied to operating panel 18, the rear area of support member 24 deforms elastically.

Figure 9:
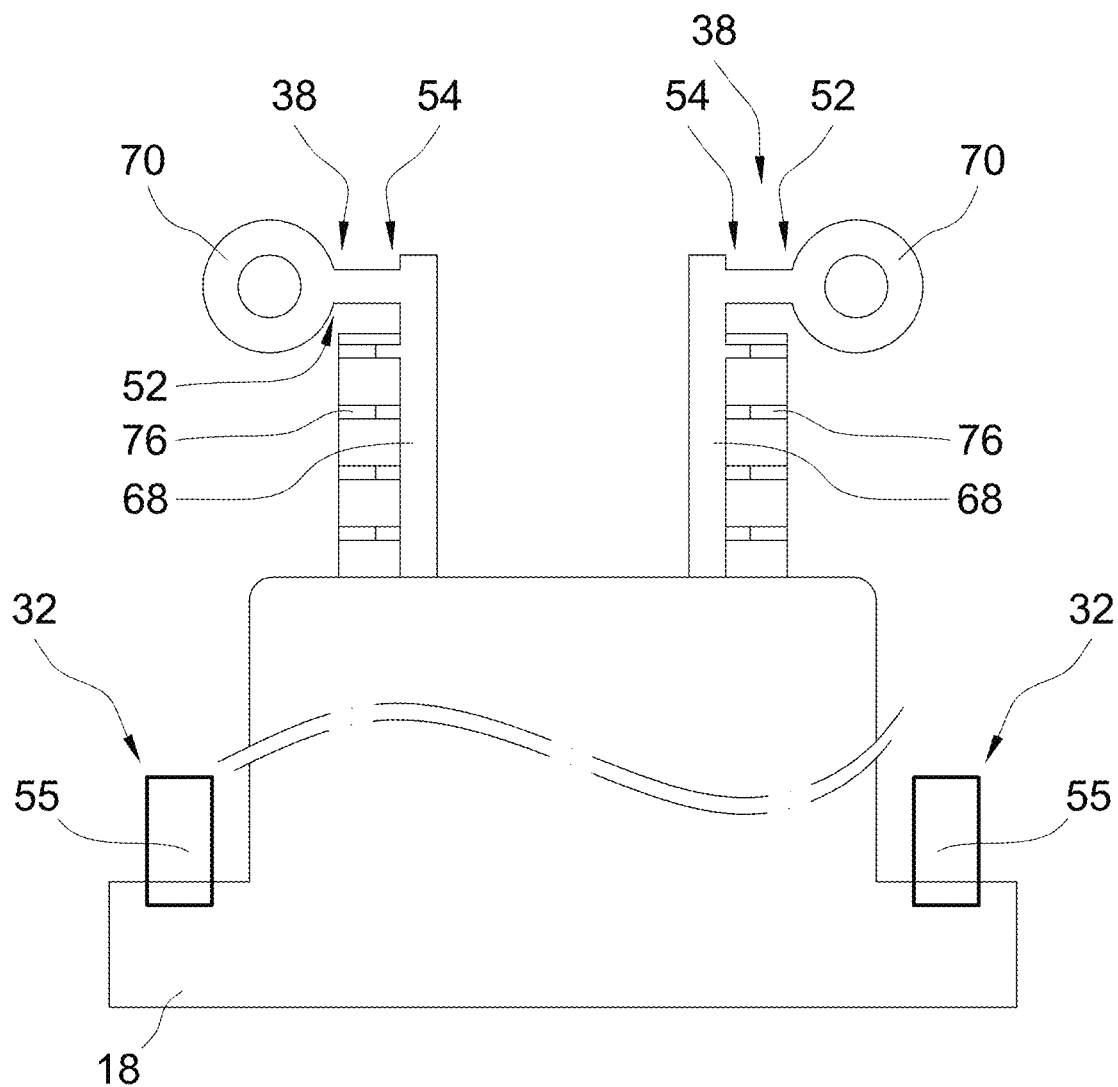

FIG. 9 shows a configuration similar to that according to FIG. 6, so that in this respect structurally and functionally identical parts are provided with the same reference numerals. In this exemplary embodiment, two support arms 68, which are stiffened by ribs 76, also extend from the rear end of the support member. The twistable struts 38 extend from the ends of the support arms 68 to the fixing blocks 70 and behave in exactly the same way as described, for example, in connection with FIG. 6.

Figure 10:
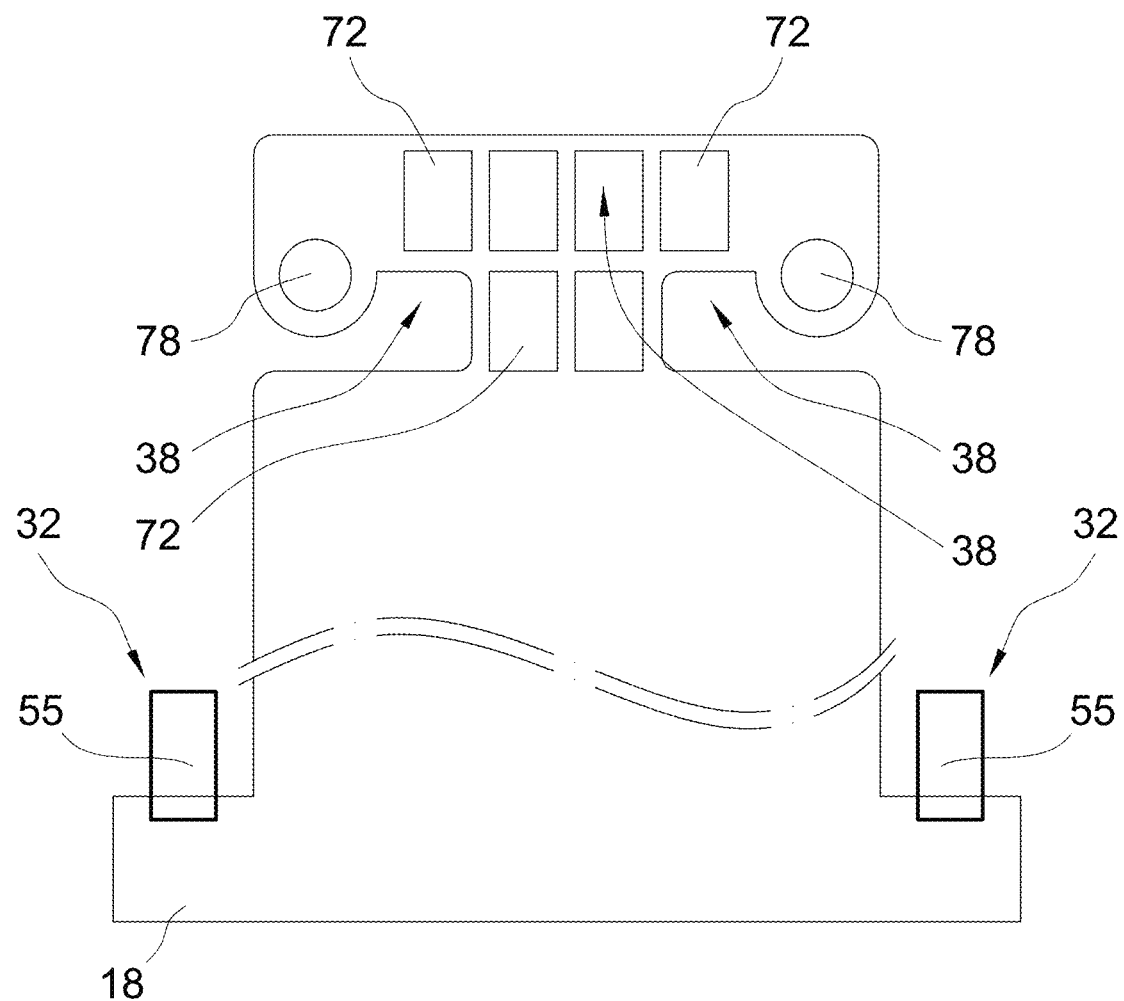
Figure 11:
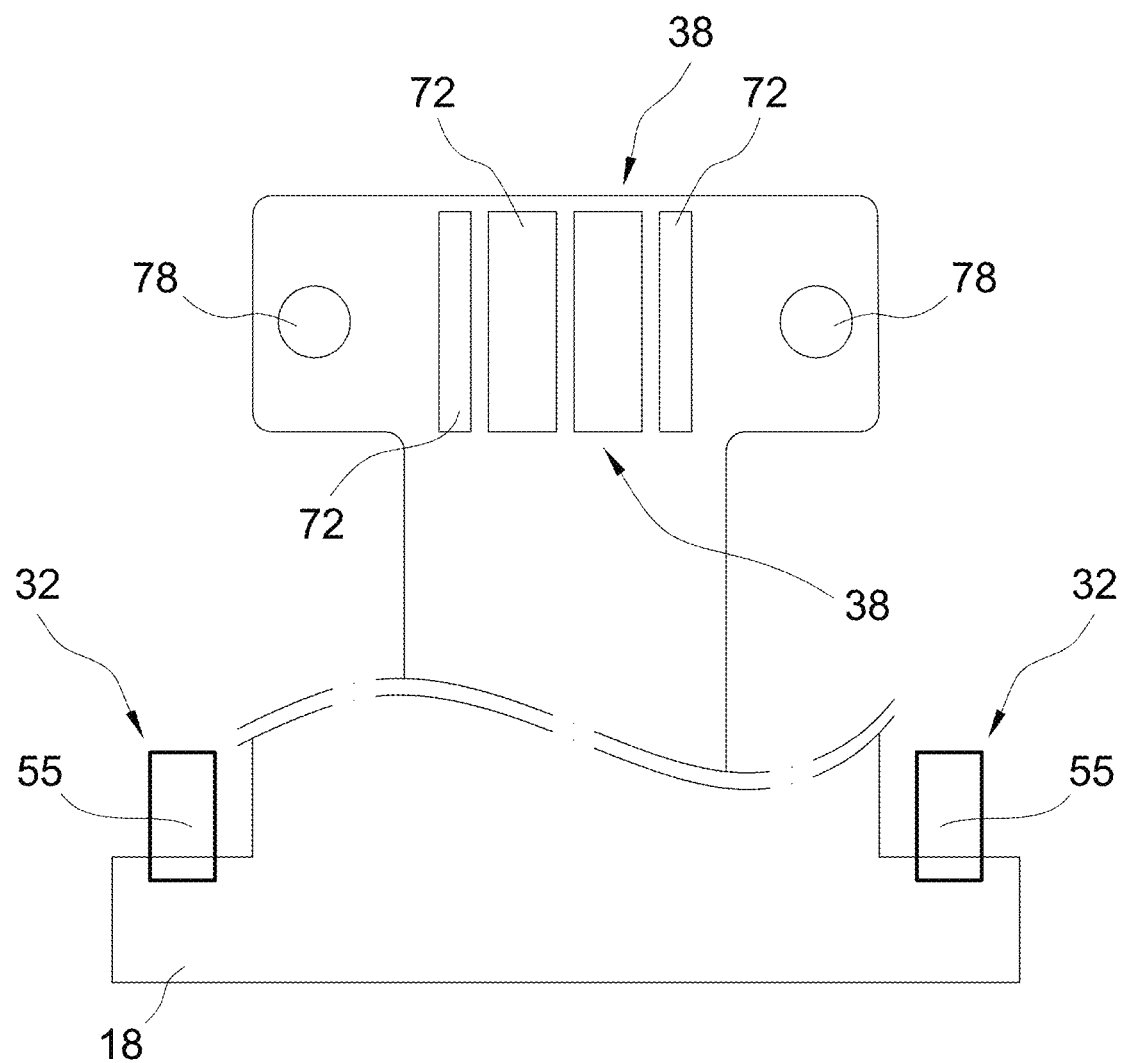

In FIGS. 10 and 11, embodiments of the rear end of support member 24 are shown, which are provided with several apertures 72. This results in twistable struts 38, which deform elastically when operating panel 18 is pressed or lifted. In FIGS. 10 and 11, the fixing points or fixing locations at which the rear structure of the support members 24 is fixed in the housing are indicated by 78. In addition to the elastic design provided by the apertures 72, the elastic mounting is also supported by the comparatively narrow configuration of support member 24 itself, for example in the exemplary embodiment of FIG. 11.

LIST OF REFERENCE NUMERALS 10 operating unit
12 housing
14 front side
16 opening
18 operating panel
20 operating fields
22 lateral ends of operating panel
24 support member for operating panel
26 opening in housing
28 rear end of support member 30 rear mounting member
32 front mounting member
34 mounting device
36 side edges of support member
38 strut of rear mounting member
40 flat material strip
42 leaf spring of rear mounting member
43 twistable area of leaf spring
44 imaginary connecting line
46 main side surface of leaf spring of rear mounting member
48 main side surfaces of leaf spring of rear mounting member
50 fixing member for leaf spring of rear mounting member
52 fixing end of strut
54 connecting end of strut
55 leaf spring (spring tongue) of front mounting member
56 distance or force sensor
58 touch-sensitive film
60 evaluation and control unit
64 actuator
66 central fixing member
68 support arm of support member
69 central rear extension of support member
70 fixing block
72 apertures
74 fixing block
76 stiffening ribs
78 fixing points of support member in housing

What is claimed is:

1. An operating unit for a vehicle, in particular for operating one or several components of the vehicle, such as a central input device (CID), comprising
a housing (12) having a front side (14),
an operating panel (18) projecting beyond the front side (14) and movable between a rest position and an actuating position, said operating panel having an operating surface with several operating fields (20) for triggering operating functions, which operating fields are arranged next to one another in the longitudinal extension of the operating panel (18) and between two lateral ends (22) of the operating panel (18) and can be actuated manually or by means of an actuating object,
a sensor system (56, 58) for detecting the actuating position of the operating surface of the operating panel (18) and for detecting a valid actuation of the operating panel (18),
a support member (24) connected to the operating panel (18), which extends from the operating panel (18) further into the housing (12) and has a rear end (28) facing away from the operating panel (18) and two side ends (36) adjacent to the lateral ends (22) of the operating panel (18), and
a mounting device (34) arranged in the housing (12) for movable mounting of the support member (24) when the operating panel (18) moves from the rest position to the actuating position and moves back, wherein the support member (24) is movably mounted on the mounting device (34) so that it can be reset,
wherein the mounting device (34) comprises at least one rear mounting member (30) for the rear end (28) of the support member (24) and at least one front mounting member (32) which interacts with the end of the support member (24) facing the operating panel (18) and/or with the operating panel (18) and is of elastic design, and
wherein the at least one or each rear mounting member (30) comprises an elastically twistable strut (38) having a longitudinal axis extending substantially parallel to an imaginary connecting line (44) connecting the two lateral ends (22) of the operating panel (18) between a mounting end (52) of the rear mounting member (30) at which the strut (38) is rigidly fixed inside the housing (12) and a connecting end (54) of the rear mounting member (30) at which the strut (38) is rigidly connected to the rear end (28) of the support member (24).

2. The operating unit according to claim 1, characterized in that the strut (38) of the at least one or each rear mounting member (30) is formed as a rod with a round or polygonal cross-section.

3. The operating unit according to claim 1, characterized in that the strut (38) of the at least one or each rear mounting member (30) is formed as a flat material strip (40) having two main side surfaces (46, 48), and that the main side surfaces (46, 48) of the flat material strip (40) are vertically aligned or tilted by less than 45° with respect to the vertical.

4. The operating unit according to claim 1, characterized in that the mounting device (34) has two rear mounting members (30), the two struts (38) of which extend from a common fixing end (52) in opposite directions to their respective connecting ends (54), at which they are rigidly connected to the rear end (28) of the support member (24).

5. The operating unit according to claim 4, characterized in that the two struts (38) are integrally connected to each other at their fixing ends (52) to form a common strut (38) and to define a central fixing portion of the common strut (38), from which the common strut (38) extends in two mutually opposite directions to its connecting ends (54) connected to the support member (24).

6. The operating unit according to claim 1, characterized in that the mounting device (34) has two rear mounting members (30), the two struts (38) of which extend from a common connecting end (54), at which they are connected to the support member (24), in opposite directions to their respective fixing ends (52), at which they are rigidly fixed directly or indirectly inside the housing (12).

7. The operating unit according to claim 6, characterized in that the two struts (38) are integrally connected to each other at their connecting ends (54) to form a common strut (38) and define a central connecting portion of the common strut (38), inside which the common strut (38) is connected to the support member (24) and from which the common strut (38) extends in two mutually opposite directions to its fixing ends (52) rigidly fixed directly or indirectly inside the housing (12).

8. The operating unit according to claim 1 characterized in that the support member (24) is designed in the form of a plate which is arranged centered in relation to the longitudinal extension of the operating panel (18).

9. The operating unit according to claim 1 characterized in that the support member (24) has two support arms (68) connected to the operating panel (18), or that two support arms (68) project from the rear end (28) of the support member (24), wherein the support arms (68) are arranged symmetrically with respect to an imaginary line of symmetry extending transversely to the extension of the operating panel (18) through its center, and that a rear mounting member (30) is arranged on each support arm (68) at its rear end (28) facing away from the operating panel (18).

10. The operating unit according to claim 1, characterized in that the mounting device (34) has two front mounting members (32) which are arranged opposite each other on the two side ends (36) of the support member (24) or the two lateral ends (22) of the operating panel (18).

11. The operating unit according to claim 1, characterized in that the at least one or each rear mounting member (30) is an integral part of the rear end (28) of the support member (24) or, if the support member (24) has support arms (68), is an integral part of the rear ends of the support arms (68) of the support member (24).

12. The operating unit according to claim 1, characterized in that the strut (38) of the at least one or each rear mounting member (30) is formed as a leaf spring (42) made of plastic or spring steel.

13. The operating unit according to claim 1, characterized in that the at least one or each front mounting member (32) is formed as a spring leaf (55) made of plastic or spring steel or as a coil spring made of plastic or spring steel.

14. The operating unit according to claim 1, characterized in that the sensor system has at least two force and/or distance sensors (56) for detecting the force that acts on the operating panel (18) when it is actuated and/or the distance by which the operating panel (18) moves when it is actuated, and an evaluation unit (60) that receives measurement signals from the sensors (56) and uses these measurement signals to generate a signal representing the actuating position on the operating panel (18) and a signal representing a valid actuation of the operating panel (18).

15. The operating unit according to claim 1, characterized in that the sensor system has a touch-sensitive film (58) arranged in or on the operating panel (18), which emits a signal representing the actuating position when the operating panel (18) is touched and/or actuated, as well as at least one force and/or distance sensor (56) for detecting the force acting on the operating panel (18) when it is actuated, and/or the distance by which the operating panel (18) moves when it is actuated, and an evaluation unit (60) that receives signals from the at least one sensor (56) and the touch-sensitive film (58) and uses these signals to generate a signal representing the actuating position on the operating panel (18) and a signal representing a valid actuation of the operating panel (18).

16. The operating unit according to claim 1, characterized by
- a display unit with a display surface arranged above and/or below the operating panel (18) for displaying alphanumeric and/or graphic information relating to the operating functions assigned to the respective operating field (20), or
- a display unit integrated in the operating panel (18) with a display surface for displaying alphanumeric and/or graphic information relating to the operating function assigned to the respective operating field (20), or
- unchangeable alphanumeric and/or graphic information.

17. The operating unit according to claim 1, characterized by a passive or active haptic feedback unit comprising an actuator (64) for generating an acoustic and/or tactile feedback upon a valid actuation of the operating panel (18).

18. The operating unit according to claim 16, wherein the unchangeable alphanumeric and/or graphic information is in the form of symbols, icons or the like on the operating panel (18).

* * * * *